US009268221B2

(12) United States Patent
Jeong et al.

(10) Patent No.: US 9,268,221 B2
(45) Date of Patent: Feb. 23, 2016

(54) POSITIVE PHOTOSENSITIVE RESIN COMPOSITION, PHOTOSENSITIVE RESIN LAYER PREPARED BY USING THE SAME, AND SEMICONDUCTOR DEVICE INCLUDING THE PHOTOSENSITIVE RESIN LAYER

(75) Inventors: Ji-Young Jeong, Uiwang-si (KR); Min-Kook Chung, Uiwang-si (KR); Jong-Hwa Lee, Uiwang-si (KR); Mi-Ra Im, Uiwang-si (KR); Hyun-Yong Cho, Uiwang-si (KR); Myoung-Hwan Cha, Uiwang-si (KR); Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/190,690

(22) Filed: Jul. 26, 2011

(65) Prior Publication Data

US 2012/0171609 A1 Jul. 5, 2012

(30) Foreign Application Priority Data

Dec. 30, 2010 (KR) .................. 10-2010-0139447

(51) Int. Cl.
*G03F 7/023* (2006.01)
*G03F 7/075* (2006.01)
*G03F 7/40* (2006.01)

(52) U.S. Cl.
CPC ............ *G03F 7/0233* (2013.01); *G03F 7/0751* (2013.01); *G03F 7/40* (2013.01)

(58) Field of Classification Search
CPC ............... H01L 2924/07025; H01L 21/02107; C08L 79/08; G03F 7/0233; G03F 7/0751; G03F 7/40
USPC .......................................... 430/270.1, 283.1
See application file for complete search history.

(56) References Cited

U.S. PATENT DOCUMENTS

| 2,772,975 | A | 12/1956 | Rickers |
| 2,797,213 | A | 6/1957 | Moore |
| 3,669,658 | A | 6/1972 | Yonezawa et al. |
| 5,114,826 | A | 5/1992 | Kwong et al. |
| 5,376,499 | A | 12/1994 | Hammerschmidt et al. |
| 5,449,584 | A | 9/1995 | Banba et al. |
| 5,486,447 | A | 1/1996 | Hammerschmidt et al. |
| 6,001,517 | A | 12/1999 | Kawamonzen |
| 6,207,356 | B1 | 3/2001 | Banba et al. |
| 6,376,151 | B1 | 4/2002 | Takahashi et al. |
| 7,056,641 | B2 | 6/2006 | Naiini et al. |
| 7,435,525 | B2 | 10/2008 | Hattori et al. |
| 8,198,002 | B2 | 6/2012 | Jung et al. |
| 8,815,489 | B2 * | 8/2014 | Jeong et al. ................. 430/191 |
| 2004/0099111 | A1 | 5/2004 | Adkins |
| 2004/0142275 | A1 | 7/2004 | Komatsu |
| 2004/0229167 | A1 | 11/2004 | Naiini et al. |
| 2006/0008734 | A1 * | 1/2006 | Amoroso et al. .......... 430/270.1 |
| 2007/0092743 | A1 * | 4/2007 | Yun et al. .................. 428/474.4 |
| 2009/0068584 | A1 * | 3/2009 | Makabe ..................... 430/270.1 |
| 2010/0062273 | A1 * | 3/2010 | Makabe et al. ............ 428/473.5 |
| 2010/0099043 | A1 * | 4/2010 | Jung et al. ................. 430/283.1 |

FOREIGN PATENT DOCUMENTS

| CN | 101600994 A | 12/2009 |
| CN | 101727006 A | 6/2010 |
| JP | 63-096162 A | 4/1988 |
| JP | 09-302221 A | 11/1997 |
| JP | 10-307393 A | 11/1998 |
| JP | 2000-292913 A | 10/2000 |
| JP | 2002-241611 | 8/2002 |
| JP | 2004-132996 | 4/2004 |
| JP | 2005-338481 | 12/2005 |
| JP | 2009-057458 | 3/2009 |
| JP | 2009-282084 | 12/2009 |
| KR | 10-2003-0018153 A | 3/2003 |
| KR | 10-2006-0085629 A | 7/2006 |
| KR | 10-2009-0056737 A | 6/2009 |
| KR | 10-2010-0044125 A | 4/2010 |

OTHER PUBLICATIONS

Miyamoto et al., machine English translation of JP 2008-020899, published Jan. 31, 2008.*
Lee et al., machine English translation of JP 2006-124626, pub. May 18, 2006.*

* cited by examiner

*Primary Examiner* — Michael Pepitone
*Assistant Examiner* — Jessica Roswell
(74) *Attorney, Agent, or Firm* — Additon, Higgins & Pendleton, P.A.

(57) ABSTRACT

Provided is a positive photosensitive resin composition that includes (A) a polybenzoxazole precursor including a first polybenzoxazole precursor including a repeating unit represented by Chemical Formula 1 and a repeating unit represented by Chemical Formula 2, and having a thermally polymerizable functional group at least one terminal end; (B) a photosensitive diazoquinone compound; (C) a silane compound; (D) a phenol compound; and (E) a solvent. A photosensitive resin film fabricated using the positive photosensitive resin composition is provided.

16 Claims, No Drawings

POSITIVE PHOTOSENSITIVE RESIN COMPOSITION, PHOTOSENSITIVE RESIN LAYER PREPARED BY USING THE SAME, AND SEMICONDUCTOR DEVICE INCLUDING THE PHOTOSENSITIVE RESIN LAYER

CROSS-REFERENCE TO RELATED APPLICATION

This application claims priority under 35 USC Section 119 to and the benefit of Korean Patent Application No. 10-2010-0139447 filed in the Korean Intellectual Property Office on Dec. 30, 2010, the entire disclosure of which is incorporated herein by reference.

FIELD OF THE INVENTION

The present application relates to a positive photosensitive resin composition, a photosensitive resin film fabricated using the same, and a semiconductor device including the photosensitive resin film.

BACKGROUND OF THE INVENTION

Conventional surface protective layers and interlayer insulating layers for a semiconductor device can include a polyimide resin, which can have excellent heat resistance, electrical characteristics, mechanical properties, and the like. Recently, a photosensitive polyimide precursor composition which can be coated easily has been used to form the polyimide resin. The photosensitive polyimide precursor composition can be coated on a semiconductor device, patterned by ultraviolet (UV) rays, developed, and heat imidized, to easily provide a surface protective layer, an interlayer insulating layer, and the like. Accordingly, it is possible to significantly shorten processing times as compared to conventional non-photosensitive polyimide precursor compositions.

The photosensitive polyimide precursor composition can be a positive type in which an exposed part is dissolved by development, or a negative type in which the exposed part is cured and maintained. Positive type photosensitive resin compositions can be developed by a non-toxic alkali aqueous solution.

An exemplary positive photosensitive polyimide precursor composition includes a polyimide precursor of polyamic acid, a photosensitive material of diazonaphthoquinone, and the like. However, the positive photosensitive polyimide precursor composition may not provide a desired pattern because the carboxylic acid of the polyamic acid can be too highly soluble in an alkali.

In order to solve this problem, a material in which a phenolic hydroxyl group has been introduced instead of carboxylic acid by esterificating polyamidic acid with an alcohol compound having at least one hydroxyl group has been suggested. This material, however, may be insufficiently developed, which can cause problems of film loss or resin delamination from the substrate.

Recently, a material in which a polybenzoxazole precursor is mixed with a diazonaphthoquinone compound has drawn attention. When the polybenzoxazole precursor composition is actually used, however, film loss of an unexposed part may significantly increase, which can make it difficult to obtain a desirable pattern after the developing process. In order to improve this, if the molecular weight of the polybenzoxazole precursor is increased, the film loss amount of the unexposed part may be reduced, but development residue (scum) can be generated, which can decrease resolution and increase development times for the exposed part.

In order to solve the problem, it has been reported that the film loss can be suppressed in non-exposed parts during development by adding a specific phenol compound to a polybenzoxazole precursor composition. However, the effect of suppressing the film loss of the unexposed part can be insufficient. Accordingly, there is still a need for a composition which can sufficiently suppress film loss and prevent the generation of development residue (scum).

A photosensitive resin composition including a novolac resin widely used as a resin for a photoresist, a polyimide precursor or a polybenzoxazole precursor, and a quinone diazide compound has been proposed to improve sensitivity and curing at a low temperature. However, since this composition has deteriorated mechanical properties and storage stability after the thermal curing, it is not useful for forming an insulation layer or a protective layer for a semiconductor device.

Examples of reported solutions to the foregoing problem include the addition of various additives to the composition and the use of a precursor compound that can cross-link and polymerize during the thermal curing. However, while such compositions may improve mechanical properties such as elongation, they lack optical properties such as sensitivity, resolution, and the like. Therefore, there continues to be a need for a composition which can exhibit excellent mechanical properties without deteriorated optical properties.

SUMMARY OF THE INVENTION

One embodiment of the present invention provides a positive photosensitive resin composition that can have excellent sensitivity, resolution, pattern profile, residue removal properties, mechanical properties, and/or reliability.

Another embodiment of the present invention provides a photosensitive resin film using fabricated using the positive photosensitive resin composition.

Yet another embodiment of the present invention provides a semiconductor device including the photosensitive resin film.

According to one embodiment of the present invention, a positive photosensitive resin composition is provided that includes (A) a polybenzoxazole precursor including a first polybenzoxazole precursor including a repeating unit represented by the following Chemical Formula 1 and a repeating unit represented by the following Chemical Formula 2, and having a thermally polymerizable functional group at least one terminal end; (B) a photosensitive diazoquinone compound; (C) a silane compound; (D) a phenol compound; and (E) a solvent.

[Chemical Formula 1]
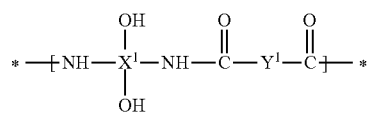

[Chemical Formula 2]
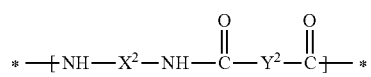

In Chemical Formulae 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 3]

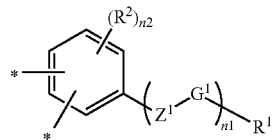

In Chemical Formula 3, $Z^1$ is the same or different in each repeating unit and is each independently a single bond, —O—, —COO—, —OCO—, —NH—, —CONH—, substituted or unsubstituted C1 to C15 alkylene, substituted or unsubstituted C2 to C15 alkenylene, or substituted or unsubstituted C2 to C15 alkynylene, $G^1$ is the same or different in each repeating unit and is each independently a single bond, a substituted or unsubstituted C6 to C30 aromatic organic group, a substituted or unsubstituted divalent to hexavalent C3 to C30 alicyclic organic group, or a substituted or unsubstituted divalent to hexavalent C2 to C30 heterocyclic group, $R^1$ is the same or different in each repeating unit and is each independently hydrogen, fluorine, hydroxy, thiol, substituted or unsubstituted C1 to C30 carboxyl, or a substituted or unsubstituted C1 to C30 aliphatic organic group, $R^2$ is the same or different in each repeating unit and is each independently hydrogen, substituted or unsubstituted C1 to C30 alkyl, substituted or unsubstituted C1 to C30 carboxyl, hydroxy, or thiol, $n_1$ is an integer ranging from 1 to 5, and $n_2$ is an integer ranging from 0 to 3.

In exemplary embodiments, the functional group represented by Chemical Formula 3 may include a functional group represented by one of the following Chemical Formulae 6 to 13, or a combination thereof.

[Chemical Formula 6]

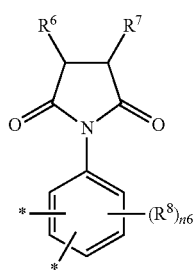

[Chemical Formula 7]

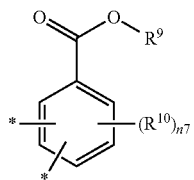

[Chemical Formula 8]

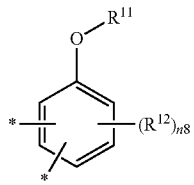

[Chemical Formula 9]

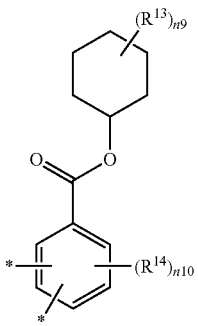

[Chemical Formula 10]

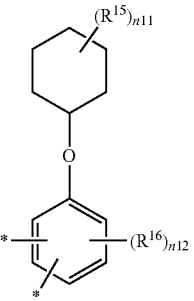

[Chemical Formula 11]

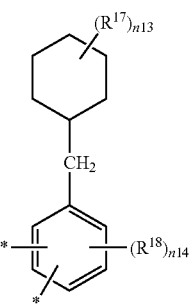

-continued

[Chemical Formula 12]

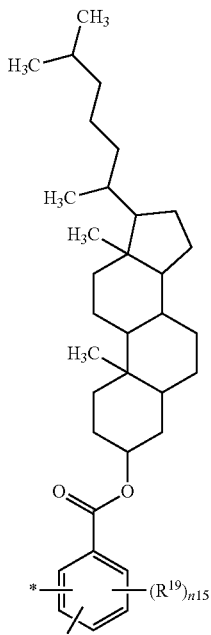

[Chemical Formula 13]

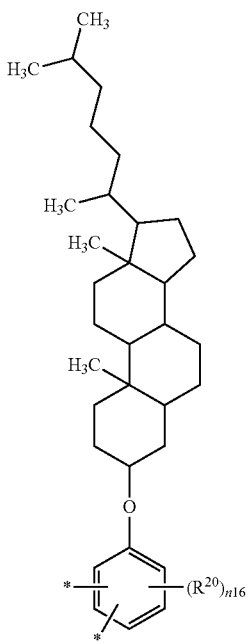

In Chemical Formulae 6 to 13, $R^6$, $R^7$, $R^9$, $R^{11}$, $R^{13}$, $R^{15}$ and $R^{17}$ are the same or different in each repeating unit and are each independently hydrogen, fluorine, hydroxy, thiol, substituted or unsubstituted C1 to C30 carboxyl, or a substituted or unsubstituted C1 to C30 aliphatic organic group, $R^8$, $R^{10}$, $R^{12}$, $R^{14}$, $R^{16}$, $R^{18}$, $R^{19}$ and $R^{20}$ are the same or different in each repeating unit and are each independently hydrogen, substituted or unsubstituted C1 to C30 alkyl, substituted or unsubstituted C1 to C30 carboxyl, hydroxy, or thiol, $n_9$, $n_{11}$ and $n_{13}$ are each independently integers ranging from 1 to 5, and $n_6$, $n_7$, $n_8$, $n_{10}$, $n_{12}$, $n_{14}$, $n_{15}$ and $n_{16}$ are each independently integers ranging from 0 to 3.

The first polybenzoxazole precursor may include a repeating unit represented by Chemical Formula 1 and a repeating unit represented by Chemical Formula 2 at a mole ratio of about 60:40 to about 95:5.

The first polybenzoxazole precursor may further include a repeating unit represented by the following Chemical Formula 32:

[Chemical Formula 32]

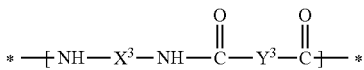

In Chemical Formula 32, $X^3$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 33, and $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 33]

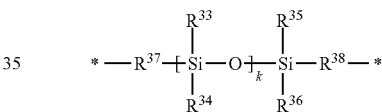

In Chemical Formula 33, $R^{33}$ to $R^{36}$ are the same or different in each repeating unit and are each independently hydrogen, substituted or unsubstituted C1 to C30 alkyl, substituted or unsubstituted C6 to C30 aryl, substituted or unsubstituted C1 to C30 alkoxy, or hydroxy, $R^{37}$ and $R^{38}$ are the same or different in each repeating unit and are each independently single bond, substituted or unsubstituted C1 to C30 alkylene, or substituted or unsubstituted C6 to C30 arylene, and k is an integer ranging from 1 to 50.

When the first polybenzoxazole precursor includes repeating units represented by Chemical Formulae 1, 2 and 32, the first polybenzoxazole precursor may include about 5 parts by mole to about 40 parts by mole of a repeating unit represented by Chemical Formula 2, and about 5 parts by mole to about 40 parts by mole of a repeating unit represented by Chemical Formula 32 based on 100 parts by mole of a repeating unit represented by Chemical Formula 1.

The first polybenzoxazole precursor may have a weight average molecular weight (Mw) of about 4,000 g/mol to about 20,000 g/mol.

The polybenzoxazole precursor may further include a second polybenzoxazole precursor including a repeating unit represented by the following Chemical Formula 38, and a thermally polymerizable functional group at least one terminal end.

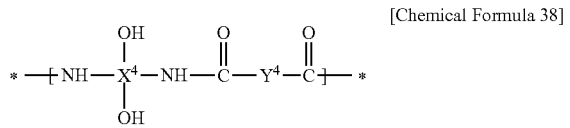

[Chemical Formula 38]

In Chemical Formula 38, $X^4$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The second polybenzoxazole precursor may have a weight average molecular weight (Mw) of about 4,000 g/mol to about 20,000 g/mol.

When the polybenzoxazole precursor includes the first polybenzoxazole precursor and the second polybenzoxazole precursor, the polybenzoxazole precursor may include the first polybenzoxazole precursor and the second polybenzoxazole precursor at a weight ratio of about 5:95 to about 95:5.

The positive photosensitive resin composition may include about 5 parts by weight to about 100 parts by weight of photosensitive diazoquinone compound (B); about 0.1 parts by weight to about 30 parts by weight of the silane compound (C); about 1 part by weight to about 30 parts by weight of the phenol compound (D); and about 50 parts by weight to about 400 parts by weight of the solvent (E), each based on 100 parts by weight of the polybenzoxazole precursor (A).

According to another embodiment of the present invention, a photosensitive resin film fabricated using the positive photosensitive resin composition is provided.

According to yet another embodiment of the present invention, a semiconductor device including the photosensitive resin film is provided.

Hereinafter, further embodiments of the present invention will be described in detail.

The positive photosensitive resin composition according to one embodiment includes a polybenzoxazole precursor including a diamine residual group having a predetermined structure capable of inhibiting dissolution for an alkali development solution, and thereby can allow effective control of dissolution rates between exposed parts and non-exposed parts. The film fabricated using the positive photosensitive resin composition can have improved mechanical properties, reliability, sensitivity, resolution, pattern profile and residue removal properties.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least a substituent including halogen (F, Br, Cl or I), hydroxy, nitro, cyano, amino ($NH_2$, $NH(R^{200})$ or $N(R^{201})$ ($R^{202}$), wherein $R^{200}$, $R^{201}$ and $R^{202}$ are the same or different and are each independently C1 to C10 alkyl), amidino, hydrazine, hydrazone, carboxyl, substituted or unsubstituted alkyl, substituted or unsubstituted alkenyl, substituted or unsubstituted alkynyl, substituted or unsubstituted alicyclic organic group, substituted or unsubstituted aryl, substituted or unsubstituted heterocyclic group, or a combination thereof, in place of at least one hydrogen of a functional group.

As used herein, when a specific definition is not otherwise provided, the term "alkyl" may refer to C1 to C30 alkyl, for example C1 to C15 alkyl, the term "alkenyl" may refer to C2 to C30 alkenyl, for example C2 to C15 alkenyl, the term "alkynyl" may refer to C2 to C30 alkynyl, for example C2 to C15 alkynl, the term "cycloalkyl" may refer to C3 to C30 cycloalkyl, for example C3 to C18 cycloalkyl, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, and the term "arylene" may refer to C6 to C30 arylene, for example C6 to C16 arylene. As used herein, when a specific definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" may refer to C6 to C30 aryl or C6 to C30 arylene, for example C6 to C16 aryl or C6 to C16 arylene, and the term "heterocyclic group" may refer to C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene which includes 1 to 3 heteroatoms including O, S, N, P, Si, or a combination thereof in place of one or more carbon ring atoms, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene which includes 1 to 3 heteroatoms including O, S, N, P, Si, or a combination thereof in place of one or more carbon ring atoms.

As used herein, when a specific definition is not otherwise provided, the term "combination" refers to mixing or copolymerization. Also, the term "copolymerization" refers to block copolymerization or random copolymerization, and the term "copolymer" refers to a block copolymer or a random copolymer.

Also, "*" refers to a linking part between the same or different atoms, or chemical formulae.

According to one embodiment of the present invention, a positive photosensitive resin composition includes (A) a polybenzoxazole precursor including a first polybenzoxazole precursor including a repeating unit represented by the following Chemical Formula 1 and a repeating unit represented by the following Chemical Formula 2, and having a thermally polymerizable functional group at least one terminal end; (B) a photosensitive diazoquinone compound; (C) a silane compound; (D) a phenol compound; and (E) a solvent.

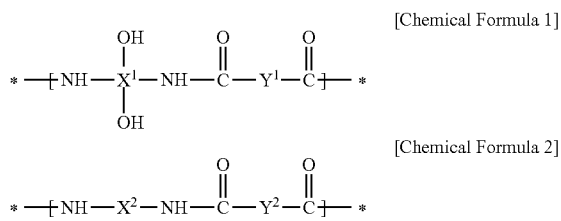

[Chemical Formula 1]

[Chemical Formula 2]

In Chemical Formulae 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

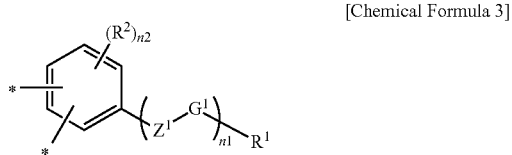

[Chemical Formula 3]

In Chemical Formula 3, $Z^1$ is the same or different in each repeating unit and is each independently a single bond, —O—, —COO—, —OCO—, —NH—, —CONH—, substituted or unsubstituted C1 to C15 alkylene, substituted or unsubstituted C2 to C15 alkenylene, or substituted or unsubstituted C2 to C15 alkynylene, for example a single bond, —O—, —COO— or C1 to C5 alkylene.

$G^1$ is the same or different in each repeating unit and is each independently a single bond, a substituted or unsubstituted C6 to C30 aromatic organic group, a substituted or unsubstituted divalent to hexavalent C3 to C30 alicyclic organic group, or a substituted or unsubstituted divalent to hexavalent C2 to C30 heterocyclic group. In exemplary embodiments, the aromatic organic group, alicyclic organic group, and a heterocyclic group include one or more rings.

$R^1$ is the same or different in each repeating unit and is each independently hydrogen, fluorine, hydroxy, thiol, substituted or unsubstituted C1 to C30 carboxyl, or a substituted or unsubstituted C1 to C30 aliphatic organic group.

$R^2$ is the same or different in each repeating unit and is each independently hydrogen, substituted or unsubstituted C1 to C30 alkyl, substituted or unsubstituted C1 to C30 carboxyl, hydroxy, or thiol.

$n_1$ is an integer ranging from 1 to 5, and $n_2$ is an integer ranging from 0 to 3.

The functional group represented by Chemical Formula 3 may partially include a hydrophilic group but show hydrophobicity overall and thus may suppress the positive photosensitive resin composition from being dissolved in an alkali development solution.

When the positive photosensitive resin composition includes the first polybenzoxazole precursor including a functional group represented by Chemical Formula 3, dissolution rates for an alkali development solution between exposed parts and non-exposed parts can be effectively controlled. Accordingly, the positive photosensitive resin composition may improve residual film ratio and pattern profile and also residue removal properties, since a residue can be effectively removed without a scum. In addition, the positive photosensitive resin composition may improve mechanical properties, reliability, sensitivity, and resolution.

The positive photosensitive resin composition may further include another additive (F).

Hereinafter, each composition component is described in detail.

(A) Polybenzoxazole Precursor

The polybenzoxazole precursor includes a first polybenzoxazole precursor including a repeating unit represented by the following Chemical Formula 1 and a repeating unit represented by the following Chemical Formula 2, and having a thermally polymerizable functional group at least one terminal end.

In Chemical Formula 1, $X^1$ may be the same or different in each repeating unit and is each independently an aromatic organic group, a tetravalent to hexavalent aliphatic organic group, or a tetravalent to hexavalent alicyclic organic group. In exemplary embodiments, $X^1$ may be the same or different in each repeating unit and is each independently aromatic organic group or tetravalent to hexavalent alicyclic organic group.

For example, $X^1$ may be a residual group derived from an aromatic diamine.

Exemplary aromatic diamines may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl) sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl) hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl) hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethyl phenyl)-2-(3-hydroxy-4-amino-5-trifluoro methylphenyl)hexafluoropropane, 2-(3-amino-4-hydroxy-5-trifluoromethyl phenyl)-2-(3-hydroxy-4-amino-6-trifluoro methylphenyl)hexafluoropropane, 2-(3-amino-4-hydroxy-5-trifluoromethylphenyl)-2-(3-hydroxy-4-amino- 2-trifluoro methylphenyl)hexafluoropropane, 2-(3-amino-4-hydroxy-2-trifluoromethyl phenyl)-2-(3-hydroxy-4-amino-5-trifluoro methylphenyl)hexafluoropropane, 2-(3-amino-4-hydroxy-6-trifluoromethyl phenyl)-2-(3-hydroxy-4-amino-5-trifluoro methylphenyl)hexafluoropropane, and the like, and combination thereofs.

$X^1$ may include a functional group represented by the following Chemical Formula 4, Chemical Formula 5, or a combination thereof, but is not limited thereto.

[Chemical Formula 4]

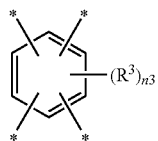

[Chemical Formula 5]

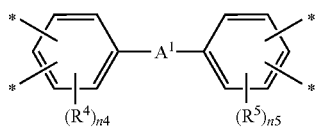

In Chemical Formulae 4 and 5, $A^1$ is O, CO, O, CO, $CR^{203}R^{204}$, $SO_2$, S, or a single bond, wherein $R^{203}$ and $R^{204}$ are the same or different and are each independently hydrogen or substituted or unsubstituted alkyl, for example fluoroalkyl, $R^3$ to $R^5$ are the same or different and are each independently hydrogen, substituted or unsubstituted alkyl, substituted or unsubstituted carboxyl, hydroxy or thiol, $n_3$ is an integer of 1 or 2, and $n_4$ and $n_5$ are the same or different and are each independently integers ranging from 1 to 3.

In Chemical Formula 2, $X^2$ is the same or different in each repeating unit and is each independently a functional group represented by Chemical Formula 3.

Exemplary functional groups represented by Chemical Formula 3 may include functional groups represented by one of the following Chemical Formulae 6 to 13, or a combination thereof, but is not limited thereto.

[Chemical Formula 6]

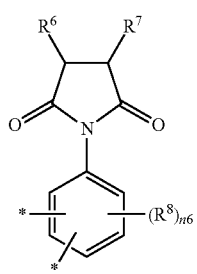

[Chemical Formula 7]

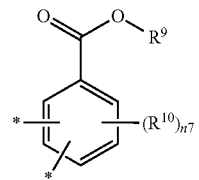

[Chemical Formula 8]

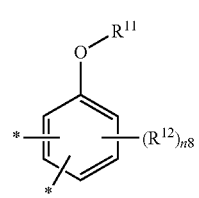

[Chemical Formula 9]

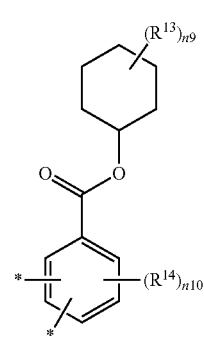

[Chemical Formula 10]

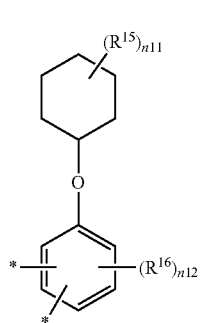

[Chemical Formula 11]

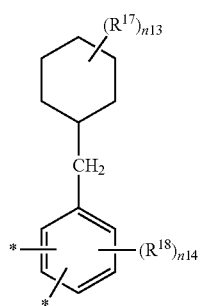

[Chemical Formula 12]

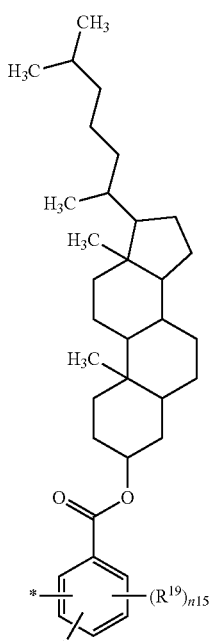

[Chemical Formula 13]

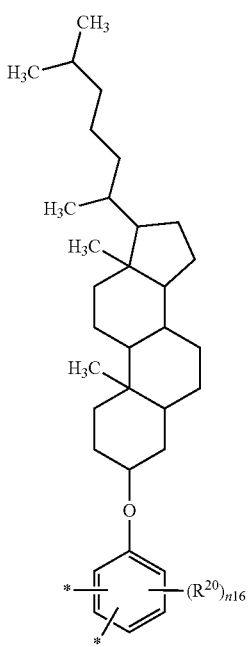

In Chemical Formulae 6 to 13, $R^6$, $R^7$, $R^9$, $R^{11}$, $R^{13}$, $R^{15}$, and $R^{17}$ are the same or different in each repeating unit and are each independently hydrogen, fluorine, hydroxy, thiol, substituted or unsubstituted C1 to C30 carboxyl, or a substituted or unsubstituted C1 to C30 aliphatic organic group, $R^8$, $R^{10}$, $R^{12}$, $R^{14}$, $R^{16}$, $R^{18}$, $R^{19}$ and $R^{20}$ are the same or different in each repeating unit and are each independently hydrogen, substituted or unsubstituted C1 to C30 alkyl, substituted or unsubstituted C1 to C30 carboxyl, hydroxy, or thiol, $n_9$, $n_{11}$ and $n_{13}$ are each independently integers ranging from 1 to 5, and $n_6$, $n_7$, $n_8$, $n_{10}$, $n_{12}$, $n_{14}$, $n_{15}$ and $n_{16}$ are each independently integers ranging from 0 to 3.

Exemplary functional groups represented by Chemical Formula 3 may include without limitation 1-(3,5-diaminophenyl)-3-octadecyl succinimide, 4-octadecoxy-1,3-benzenediamine, 4-cholesteryloxy-1,3-benzenediamine, 4-cyclohexylmethyl-1,3-benzenediamine, 4-cyclohexyloxy-1,3-benzenediamine, 4-dodecyloxy-1,3-benzenediamine, and the like, and combinations thereof.

In Chemical Formulae 1 and 2, $Y^1$ and $Y^2$ are the same or different in each repeating unit and are each independently an aromatic organic group, a divalent to hexavalent aliphatic organic group, or a divalent to hexavalent alicyclic organic group. In exemplary embodiments, $Y^1$ and $Y^2$ are the same or different in each repeating unit and are each independently an aromatic organic group or a divalent to hexavalent alicyclic organic group.

For example, $Y^1$ and $Y^2$ may be a residual group of dicarboxylic acid or a residual group of a dicarboxylic acid derivative.

Examples of the dicarboxylic acid include without limitation $Y^1(COOH)_2$ or $Y^2(COOH)_2$ (wherein $Y^1$ and $Y^2$ are the same as $Y^1$ and $Y^2$ of Chemical Formulae 1 and 2).

Examples of the dicarboxylic acid derivative include without limitation a carbonyl halide derivative of $Y^1(COOH)_2$, a carbonyl halide derivative of $Y^2(COOH)_2$, an active compound of an active ester derivative obtained by reacting $Y^1(COOH)_2$ and 1-hydroxy-1,2,3-benzotriazole, or an active compound of an active ester derivative obtained by reacting $Y^2(COOH)_2$ and 1-hydroxy-1,2,3-benzotriazole (wherein $Y^1$ and $Y^2$ are the same as $Y^1$ and $Y^2$ of Chemical Formulae 1 and 2).

Exemplary dicarboxylic acid derivatives may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

$Y^1$ and $Y^2$ may include a functional group represented by one of the following Chemical Formulae 14 to 16, or a combination thereof, but is not limited thereto.

[Chemical Formula 14]

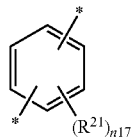

[Chemical Formula 15]

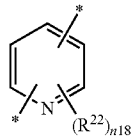

[Chemical Formula 16]

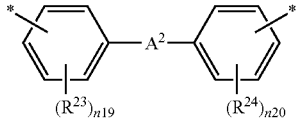

In Chemical Formulae 14 to 16, $R^{21}$ to $R^{24}$ are the same or different and are each independently hydrogen or substituted or unsubstituted alkyl, $n_{17}$ is an integer ranging from 1 to 4, $n_{18}$, $n_{19}$ and $n_{20}$ are integers ranging from 1 to 3, $A^2$ is O, $CR^{205}R^{206}$, CO, CONH, S, $SO_2$, or a single bond, wherein $R^{205}$ and $R^{206}$ are the same or different and are each independently hydrogen or substituted or unsubstituted alkyl, for example fluoroalkyl.

The first polybenzoxazole precursor includes a thermally polymerizable functional group at least one terminal end. The thermally-polymerizable functional group may play a role of thermally-binding polymer chains and thus extending chain length or cross-linking with a cross-linking agent to make a film firm. As a result, it may expand or increase the molecular weight of a polymer with a low molecular weight, which can improve film characteristics.

The thermally polymerizable functional group may be derived from an end-capping monomer. Exemplary end-capping monomers include without limitation monoamines, monoanhydrides, monocarboxylic acid halides having a carbon-carbon multiple bond, and the like, and combinations thereof.

Exemplary monoamines include without limitation toluidine, dimethylaniline, ethylaniline, aminophenol, aminobenzylalcohol, aminoindan, aminoacetonephenone, and the like, and combinations thereof.

Examples of the monoanhydrides include without limitation 5-norbornene-2,3-dicarboxylic anhydride represented by the following Chemical Formula 17, 3,6-epoxy-1,2,3,6-tetrahydrophthalic anhydride represented by he following Chemical Formula 18, isobutenyl succinic anhydride represented by the following Chemical Formula 19, maleic anhydride, aconitic anhydride, 3,4,5,6-tetrahydrophthalic anhydride, cis-1,2,3,6-tetrahydrophthalic anhydride, itaconic anhydride (IA), citraconic anhydride (CA), 2,3-dimethylmaleic anhydride, (DMMA), and the like, and combinations thereof.

[Chemical Formula 17]

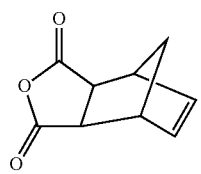

[Chemical Formula 18]

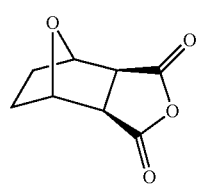

[Chemical Formula 19]

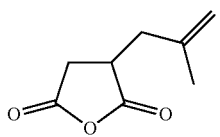

The thermally polymerizable functional group derived from the monoanhydrides may include functional groups represented by one of the following Chemical Formulae 20 to 24, or a combination thereof, but is not limited thereto. Such a thermally polymerizable functional group can be cross-linked during a heating step in a process for making the first polybenzoxazole precursor to form a residual group at the terminal end of the first polybenzoxazole precursor.

[Chemical Formula 20]

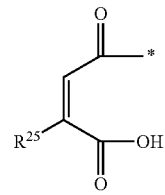

In Chemical Formula 20, $R^{25}$ is H, $CH_2COOH$, or $CH_2CHCHCH_3$.

[Chemical Formula 21]

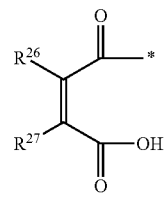

In Chemical Formula 21,
$R^{26}$ and $R^{27}$ are the same or different and are each independently H or $CH_3$.

[Chemical Formula 22]

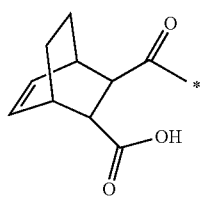

[Chemical Formula 23]

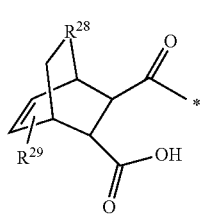

In Chemical Formula 23,
$R^{28}$ is $CH_2$ or O, and $R^{29}$ is H or $CH_3$.

[Chemical Formula 24]

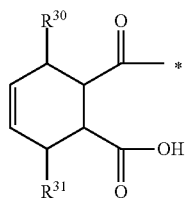

In Chemical Formula 24,
$R^{30}$ and $R^{31}$ are the same or different and are each independently H, $CH_3$ or $OCOCH_3$.

The monocarboxylic acid halides having a carbon-carbon multiple bond may be represented by the following Chemical Formula 25.

[Chemical Formula 25]

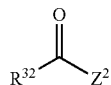

In Chemical Formula 25, $R^{32}$ is a substituted or unsubstituted alicyclic organic group or a substituted or unsubstituted aromatic organic group, wherein the substituted alicyclic organic group or substituted aromatic organic group is substituted with substituted or unsubstituted amidino group, a substituted or unsubstituted alicyclic organic group, or a fused ring of a substituted or unsubstituted alicyclic organic group and an aryl group, for example, the alicyclic organic group may be substituted with a maleimide group, and $Z^2$ is F, Cl, Br, or I.

Examples of the monocarboxylic acid halides having a carbon-carbon multiple bond include without limitation 5-norbornene-2-carboxylic acid halide represented by the following Chemical Formula 26, 4-nadimido benzoylhalide represented by the following Chemical Formula 27, 4-(4-phenylethynylphthalimido)benzoylhalide represented by the following Chemical Formula 29, 4-(2-phenylmaleimido) benzoylhalide represented by the following Chemical Formula 28, benzoylhalide represented by the following Chemical Formula 30, cyclohexyl formylhalide represented by the following Chemical Formula 31, 4-(3-phenylethynylphthalimido)benzoylhalide, 4-maleimido benzoylhalide, and the like, and combinations thereof. These may be used singularly or as a mixture thereof.

[Chemical Formula 26]

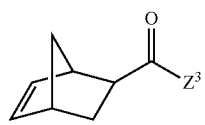

[Chemical Formula 27]

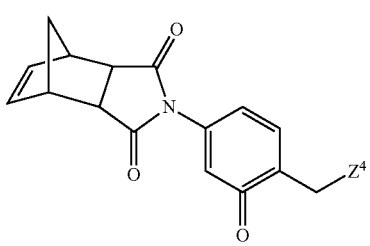

[Chemical Formula 28]

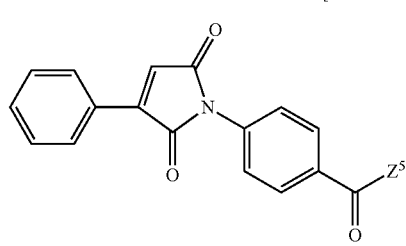

[Chemical Formula 29]

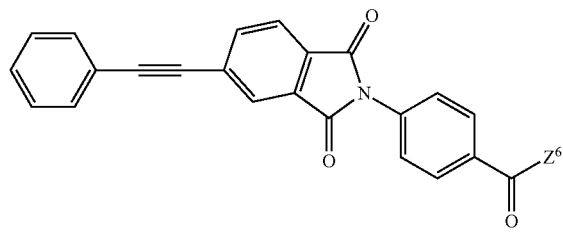

[Chemical Formula 30]

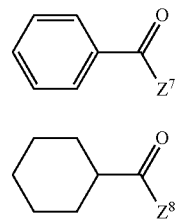

[Chemical Formula 31]

In Chemical Formulae 26 to 31, $Z^3$ to $Z^8$ are the same or different and are each independently F, Cl, Br or I.

The first polybenzoxazole precursor may include a repeating unit represented by Chemical Formula 1 and a repeating unit represented by Chemical Formula 2 at a mole ratio of about 60:40 to about 95:5.

In some embodiments, the first polybenzoxazole precursor may include a repeating unit represented by Chemical Formula 1 in an amount of about 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 mole %. Further, according to some embodiments of the present invention, the amount of the repeating unit represented by Chemical Formula 1 can be in a range from about any of the foregoing amounts to about any other of the foregoing amounts.

In some embodiments, the first polybenzoxazole precursor may include a repeating unit represented by Chemical Formula 2 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 mole %. Further, according to some embodiments of the present invention, the amount of the repeating unit represented by Chemical Formula 2 can be in a range from about any of the foregoing amounts to about any other of the foregoing amounts.

When the first polybenzoxazole precursor includes a repeating unit represented by Chemical Formula 1 and a repeating unit represented by Chemical Formula 2 in amounts within the above ranges, it may suppress the positive photosensitive resin composition from being dissolved in an alkali development solution in non-exposed parts. Accordingly, the positive photosensitive resin composition may effectively improve residual film ratio and pattern profile of a film and remove its residue without scum and thus effectively improve residue removal properties of the film. In addition, the positive photosensitive resin composition may improve mechanical properties, reliability, sensitivity, and resolution of the film.

The first polybenzoxazole precursor may further include a repeating unit represented by the following Chemical Formula 32.

[Chemical Formula 32]

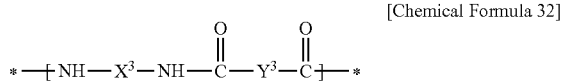

In Chemical Formula 32, $X^3$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 33, and $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group,

[Chemical Formula 33]

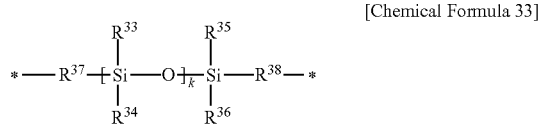

In Chemical Formula 33, $R^{33}$ to $R^{36}$ are the same or different, and are each independently hydrogen, substituted or unsubstituted C1 to C30 alkyl, substituted or unsubstituted C6 to C30 aryl, substituted or unsubstituted C1 to C30 alkoxy, or hydroxy, $R^{37}$ and $R^{38}$ are the same or different and are each independently single bond, substituted or unsubstituted C1 to C30 alkylene, or substituted or unsubstituted C6 to C30 arylene, and k is an integer ranging from 1 to 50.

When the first polybenzoxazole precursor further includes a repeating unit represented by Chemical Formula 32, it may have a harder chain structure during the ring-closing and which can increase glass transition temperature ($T_g$) and effectively improve film characteristics.

In Chemical Formula 32, $X^3$ is the same or different in each repeating unit and is each independently an aromatic organic group, a divalent to hexavalent aliphatic organic group, a divalent to hexavalent alicyclic organic group, or a functional group represented by Chemical Formula 33. In exemplary embodiments, $X^3$ may be the same or different in each repeating unit and is each independently an aromatic organic group, a divalent to hexavalent alicyclic organic group, or a functional group represented by Chemical Formula 33.

For example, $X^3$ may be a residual group derived from an aromatic diamine, an aliphatic diamine, an alicyclic diamine or a silicon diamine, and as another example $X^3$ may be a residual group derived from an aromatic diamine, an alicyclic diamine, or a silicon diamine.

Exemplary aromatic diamines may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds including an aromatic ring of the foregoing amines substituted with an alkyl group or a halogen, and the like, and combinations thereof.

Exemplary alicyclic diamine may include without limitation 1,4-diaminocyclohexane, 1,3-diaminocyclohexane, 1,2-diaminocyclohexane, 4,4'-methylenebiscyclohexylamine, 4,4'-methylenebis(2-methylcyclohexylamine), and the like, and combinations thereof.

Exemplary silicon diamines may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

$X^3$ may include a functional group represented by one of the following Chemical Formulae 34 and 37, or a combination thereof, but is not limited thereto.

[Chemical Formula 34]

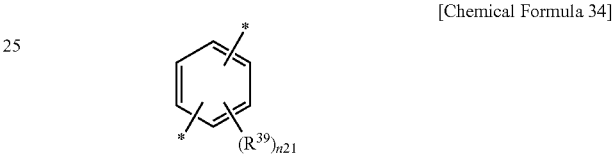

[Chemical Formula 35]

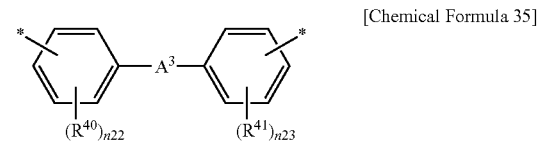

[Chemical Formula 36]

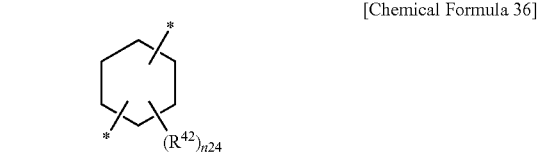

[Chemical Formula 37]

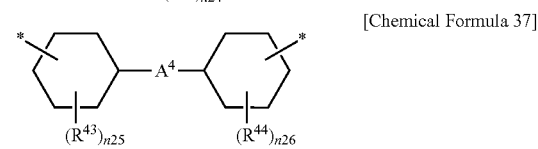

In Chemical Formulae 34 to 37, $A^3$ and $A^4$ are the same or different and are each independently O, CO, $CR^{207}R^{208}$, $SO_2$, S, or a single bond, wherein $R^{207}$ and $R^{208}$ are the same or different and are each independently hydrogen or substituted or unsubstituted alkyl, for example fluoroalkyl, $R^{39}$ to $R^{44}$ are the same or different and are each independently hydrogen, substituted or unsubstituted alkyl, substituted or unsubstituted carboxyl, hydroxy, or thiol, $n_{21}$ and $n_{24}$ are the same or different and are each independently integers ranging from 1 to 4, and $n_{22}$, $n_{23}$, $n_{25}$ and $n_{26}$ are the same or different and are each independently integers ranging from 1 to 5.

In Chemical Formula 32, $Y^3$ is the same or different in each repeating unit and is each independently an aromatic organic group, a divalent to hexavalent aliphatic organic group, or a divalent to hexavalent alicyclic organic group. For example, $Y^3$ is the same or different in each repeating unit and is each independently an aromatic organic group or a divalent to hexavalent alicyclic organic group.

As another example, $Y^3$ is a residual group of dicarboxylic acid or a residual group of a dicarboxylic acid derivative.

Examples of the dicarboxylic acid include $Y^3(COOH)_2$ (wherein $Y^3$ is the same as $Y^3$ of Chemical Formula 32).

Examples of the dicarboxylic acid derivative include a carbonyl halide derivative of $Y^3(COOH)_2$, or an active compound of an active ester derivative obtained by reacting $Y^3(COOH)_2$ and 1-hydroxy-1,2,3-benzotriazole (wherein $Y^3$ is the same as $Y^3$ of Chemical Formula 32).

Examples of the dicarboxylic acid derivative are the same as described above.

$Y^3$ may include a functional group represented by one of the following Chemical Formulae 14 to 16, or a combination thereof, but is not limited thereto.

When the first polybenzoxazole precursor includes repeating units represented by Chemical Formulae 1, 2 and 32, the first polybenzoxazole precursor may include about 5 parts by mole to about 40 parts by mole of a repeating unit represented by Chemical Formula 2, and about 5 parts by mole to about 40 parts by mole of a repeating unit represented by Chemical Formula 32 based on 100 parts by mole of a repeating unit represented by Chemical Formula 1.

In some embodiments, the first polybenzoxazole precursor may include repeating units represented by Chemical Formula 2 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 parts by mole. Further, according to some embodiments of the present invention, the amount of the repeating units represented by Chemical Formula 2 can be in a range from about any of the foregoing amounts to about any other of the foregoing amounts.

In some embodiments, the first polybenzoxazole precursor may include repeating units represented by Chemical Formula 32 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 parts by mole. Further, according to some embodiments of the present invention, the amount of the repeating units represented by Chemical Formula 32 can be in a range from about any of the foregoing amounts to about any other of the foregoing amounts.

When the repeating units represented by Chemical Formulas 1, 2, and 32 are included in amounts within the above ranges, the composition may improve sensitivity and easily control patterning and development after the exposure.

The first polybenzoxazole precursor may include a weight average molecular weight (Mw) of about 4,000 g/mol to about 20,000 g/mol, for example about 5,000 g/mol to about 15,000 g/mol. When the first polybenzoxazole precursor has a weight average molecular weight within the above range, it may effectively control development rate and thus can improve pattern-forming properties and residual film ratio characteristics. In addition, the composition may have sufficient dissolution in an organic solvent.

The polybenzoxazole precursor may further include a second polybenzoxazole precursor including a repeating unit represented by the following Chemical Formula 38, and a thermally polymerizable functional group at least one terminal end.

[Chemical Formula 38]

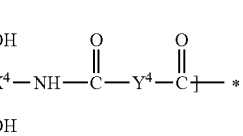

In Chemical Formula 38, $X^4$ are the same or different in each repeating unit and are each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

When the polybenzoxazole precursor further includes a second polybenzoxazole precursor, developability of non-exposed parts and exposed parts may be effectively controlled, which can increase contrast ratio.

In Chemical Formula 38, $X^4$ is the same or different in each repeating unit and is each independently an aromatic organic group, a tetravalent to hexavalent aliphatic organic group, or a tetravalent to hexavalent alicyclic organic group. For example, $X^4$ may be the same or different in each repeating unit and is each independently an aromatic organic group or a tetravalent to hexavalent alicyclic organic group.

As another example, $X^4$ may be a residual group derived from an aromatic diamine.

Examples of the aromatic diamine are the same as examples of the aromatic diamine described in relation to $X^1$ of Chemical Formula 1.

$X^4$ may include a functional group represented by one of the following Chemical Formulae 4 and 5, or a combination thereof, but is not limited thereto.

In Chemical Formula 38, $Y^4$ are the same or different in each repeating unit and are each independently an aromatic organic group, a divalent to hexavalent aliphatic organic group, or a divalent to hexavalent alicyclic organic group. For example, $Y^4$ are the same or different in each repeating unit and are each independently an aromatic organic group or a divalent to hexavalent alicyclic organic group.

As another example, $Y^4$ is a residual group of dicarboxylic acid or a residual group of a dicarboxylic acid derivative.

Examples of the dicarboxylic acid include $Y^4(COOH)_2$ (wherein $Y^4$ is the same as $Y^4$ of Chemical Formula 38).

Examples of the dicarboxylic acid derivative include a carbonyl halide derivative of $Y^4(COOH)_2$, or an active compound of an active ester derivative obtained by reacting $Y^4(COOH)_2$ and 1-hydroxy-1,2,3-benzotriazole (wherein $Y^4$ is the same as $Y^4$ of Chemical Formula 38).

Examples of the dicarboxylic acid derivative are the same as described above.

$Y^4$ may include a functional group represented by one of the above Chemical Formulae 14 to 16, or a combination thereof, but is not limited thereto.

The second polybenzoxazole precursor may have a weight average molecular weight (Mw) of about 4,000 g/mol to about 20,000 g/mol, for example about 5,000 g/mol to about 15,000 g/mol. When the second polybenzoxazole precursor compound had a weight average molecular weight in an amount within the above range, development rate may be effectively controlled, which can improve pattern-forming properties and residual film ratio characteristics.

The positive photosensitive resin composition may include the first polybenzoxazole precursor and the second polybenzoxazole precursor in various mixing ranges. When the polybenzoxazole precursor includes the first polybenzoxazole precursor and the second polybenzoxazole precursor, the first and second polybenzoxazole precursors may be included at a weight ratio ranging from about 5:95 to about 95:5.

In some embodiments, the polybenzoxazole precursor may include the first polybenzoxazole precursor in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of the first polybenzoxazole precursor can be in a range from about any of the foregoing amounts to about any other of the foregoing amounts.

In some embodiments, the polybenzoxazole precursor may include the second polybenzoxazole precursor in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of the second polybenzoxazole precursor can be in a range from about any of the foregoing amounts to about any other of the foregoing amounts.

When the first and second polybenzoxazole precursors are included in amounts within the above range, developability in non-exposed parts and exposed parts may be effectively controlled, which can improve sensitivity and residual film ratio characteristics.

(B) Photosensitive Diazoquinone Compound

The photosensitive diazoquinone compound may be a compound including a 1,2-benzoquinone diazide or 1,2-naphtoquinone diazide structure.

The photosensitive diazoquinone compound may include a compound represented by one of the following Chemical Formulae 39 and 41 to 43, or a combination thereof, but is not limited thereto.

[Chemical Formula 39]

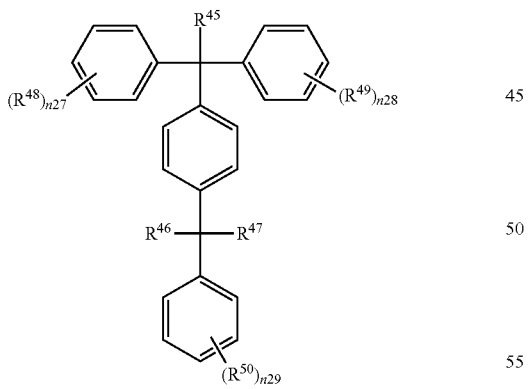

In Chemical Formula 39, $R^{45}$ to $R^{47}$ are the same or different and are each independently hydrogen or substituted or unsubstituted C1 to C30 alkyl, for example $CH_3$, $R^{48}$ to $R^{50}$ are the same or different and are independently OQ, wherein Q is hydrogen, the following Chemical Formula 40a or Chemical Formula 40b, provided that all Qs are not simultaneously hydrogen, and $n_{27}$ to $n_{29}$ are each independently integers ranging from 1 to 3.

[Chemical Formula 40a]

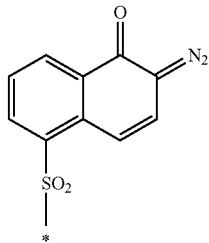

[Chemical Formula 40b]

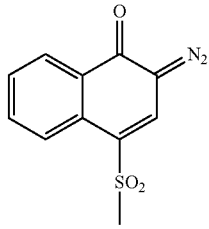

[Chemical Formula 41]

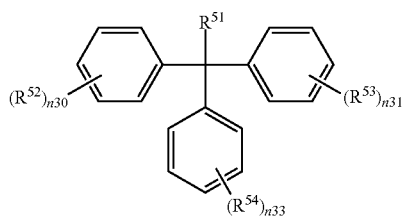

In Chemical Formula 41, $R^{51}$ is hydrogen or substituted or unsubstituted C1 to C30 alkyl, $R^{52}$ to $R^{54}$ are the same or different and are independently OQ, wherein Q is the same as defined in the above Chemical Formula 39, and $n_{30}$ to $n_{32}$ are each independently integers ranging from 1 to 3.

[Chemical Formula 42]

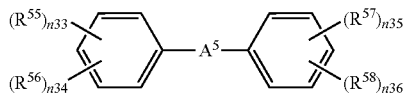

In Chemical Formula 42, $A^5$ is CO or $CR^{209}R^{210}$, wherein $R^{209}$ and $R^{210}$ are the same or different and are each independently substituted or unsubstituted C1 to C30 alkyl, $R^{55}$ to $R^{58}$ are the same or different and are each independently hydrogen, substituted or unsubstituted C1 to C30 alkyl, OQ, or NHQ wherein Q is the same as defined in the above Chemical Formula 39, $n_{33}$ to $n_{36}$ are independently integers ranging from 1 to 4, and $n_{33}+n_{34}$ and $n_{35}+n_{36}$ are independently integers of 5 or less, provided that at least one of $R^{55}$ and $R^{56}$ is OQ, and one aromatic ring includes one to three OQs and the other aromatic ring includes one to four OQs.

[Chemical Formula 43]

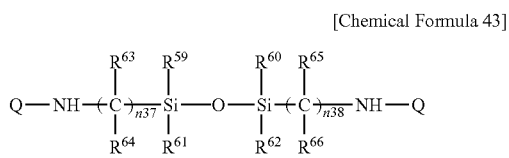

In Chemical Formula 43, $R^{59}$ to $R^{66}$ are the same or different and are each independently hydrogen or substituted or unsubstituted C1 to C30 alkyl, $n_{37}$ and $n_{38}$ are each independently integers ranging from 1 to 5, and Q is the same as defined in the above Chemical Formula 39.

The positive photosensitive resin composition may include the photosensitive diazoquinone compound in an amount of about 5 to about 100 parts by weight based on 100 parts by weight of the polybenzoxazole precursor. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 parts by weight. Further, according to some embodiments of the present invention, the amount of the photosensitive diazoquinone compound can be in a range from about any of the foregoing amounts to about any other of the foregoing amounts.

When the amount of the photosensitive diazoquinone compound is within the above range, the pattern can be well-formed without a residue from exposure, and film thickness loss during development can be prevented to thereby provide a good pattern.

(C) Silane Compound

The silane compound improves adherence between the photosensitive resin composition and a substrate.

Exemplary silane compounds may include without limitation compounds represented by the following Chemical Formulae 44 to 46, and combinations thereof; silane compounds having a carbon-carbon unsaturated bond such as vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, trimethoxy[3-(phenylamino)propyl]silane; and the like, and combinations thereof.

[Chemical Formula 44]

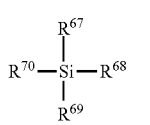

In Chemical Formula 44, $R^{67}$ is a vinyl group, substituted or unsubstituted alkyl, or substituted or unsubstituted aryl, for example 3-(meth)acryloxypropyl, p-styryl, or 3-(phenylamino)propyl, $R^{68}$ to $R^{70}$ are the same or different and are each independently substituted or unsubstituted alkoxy, substituted or unsubstituted alkyl, or halogen, provided that at least one of $R^{68}$ to $R^{70}$ is alkoxy or halogen. The alkoxy may be C1 to C8 alkoxy, and the alkyl may be C1 to C20 alkyl.

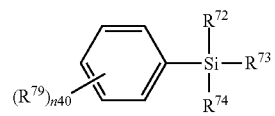

In Chemical Formula 45, $R^{71}$ is $NH_2$ or $CH_3CONH$, $R^{72}$ to $R^{74}$ are the same or different and are each independently substituted or unsubstituted alkoxy, for example $OCH_3$ or $OCH_2CH_3$, and $n_{39}$ is an integer ranging from 1 to 5.

[Chemical Formula 46]

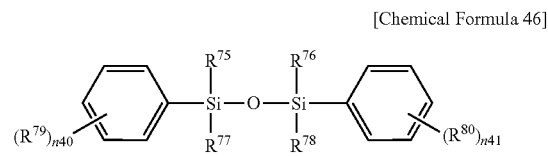

In Chemical Formula 46, $R^{75}$ to $R^{78}$ are the same or different and are each independently substituted or unsubstituted alkyl or substituted or unsubstituted alkoxy, for example $CH_3$ or $OCH_3$, $R^{79}$ and $R^{80}$ are the same or different and are each independently substituted or unsubstituted amino, for example $NH_2$ or $CH_3CONH$, and $n_{40}$ and $n_{41}$ are the same or different and are each independently are integers ranging from 1 to 5.

The positive photosensitive resin composition may include the silane compound in an amount of about 0.1 to about 30 parts by weight based on 100 parts by weight of the polybenzoxazole precursor. In some embodiments, the positive photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the silane compound is included in an amount within the above range, adherence between lower and upper layers can be sufficiently improved, residual film may not remain after development, and optical characteristics (transmittance) and mechanical properties such as tensile strength and elongation may be improved.

(D) Phenol Compound

The phenol compound increases dissolution rate and sensitivity of exposed parts during development using an alkali aqueous solution to form a pattern using a photosensitive resin composition, and plays a role of forming high resolution patterns without residues.

Exemplary phenol compounds include compounds represented by the following Chemical Formulae 47 to 53, and combinations thereof, but is not limited thereto.

[Chemical Formula 47]

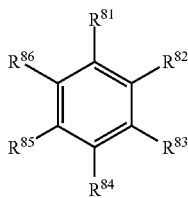

In Chemical Formula 47, $R^{81}$ to $R^{86}$ are the same or different and are each independently H, OH, substituted or unsubstituted C1 to C10 alkyl, substituted or unsubstituted C1 to C10 alkoxy, or substituted or unsubstituted C1 to C10 alkoxyalkyl, provided that at least one of $R^{81}$ to $R^{86}$ is hydroxy, and not all of $R^{81}$ to $R^{86}$ are hydroxy.

[Chemical Formula 48]

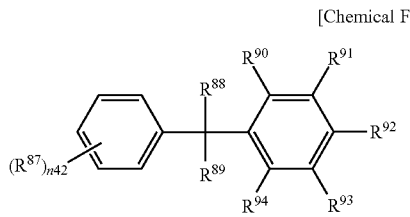

In Chemical Formula 48, $R^{87}$ to $R^{89}$ are the same or different and are each independently hydrogen or substituted or unsubstituted alkyl, $R^{90}$ to $R^{94}$ are the same or different and are each independently H, OH, or substituted or unsubstituted alkyl, for example $CH_3$, and $n_{42}$ is an integer ranging from 1 to 5.

[Chemical Formula 49]

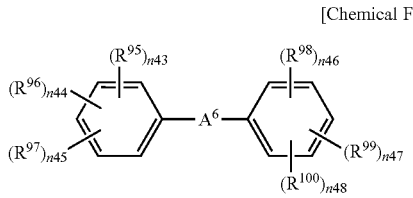

In Chemical Formula 49, $R^{95}$ to $R^{100}$ are the same or different and are each independently H, OH, or substituted or unsubstituted alkyl, $A^6$ is $CR^{211}R^{212}$ or a single bond, wherein $R^{211}$ and $R^{212}$ are the same or different and are each independently hydrogen or substituted or unsubstituted alkyl, for example $CH_3$, and $n_{43}+n_{44}+n_{45}$ and $n_{46}+n_{47}+n_{48}$ are the same or different and are each independently integers of 5 or less.

[Chemical Formula 50]

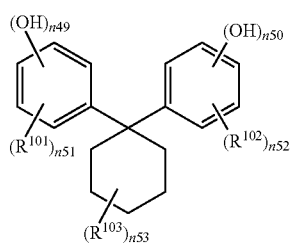

In Chemical Formula 50, $R^{101}$ to $R^{103}$ are the same or different and are each independently hydrogen or substituted or unsubstituted alkyl, $n_{49}$, $n_{50}$ and $n_{53}$ are the same or different and are each independently integers ranging from 1 to 5, and $n_{51}$ and $n_{52}$ are the same or different and are each independently integers ranging from 0 to 4.

[Chemical Formula 51]

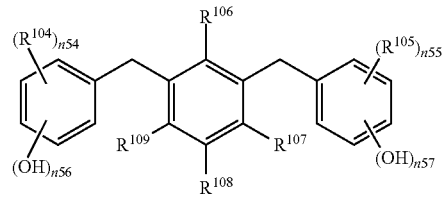

In Chemical Formula 51, $R^{104}$ to $R^{109}$ are the same or different and are each independently hydrogen, OH, or substituted or unsubstituted alkyl, $n_{54}$ to $n_{57}$ are the same or different and are each independently integers ranging from 1 to 4, provided that $n_{54}+n_{56}$ and $n_{55}+n_{57}$ are the same or different and are each independently integers of 5 or less.

[Chemical Formula 52]

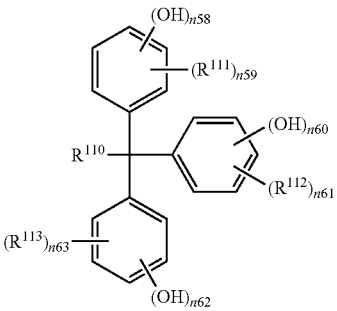

In Chemical Formula 52, $R^{110}$ is substituted or unsubstituted alkyl, for example $CH_3$, $R^{111}$ to $R^{113}$ are the same or different and are each independently hydrogen or substituted or unsubstituted alkyl, $n_{58}$, $n_{60}$ and $n_{62}$ are the same or different and are each independently integers ranging from 1 to 5, and $n_{59}$, $n_{61}$, and $n_{63}$ are the same or different and are each independently integers ranging from 0 to 4, provided that $n_{58}+n_{59}$, $n_{60}+n_{61}$ and $n_{62}+n_{63}$ are the same or different and are each independently integer of 5 or less.

[Chemical Formula 53]

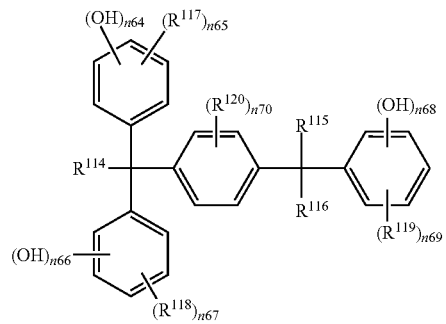

In Chemical Formula 53, $R^{114}$ to $R^{116}$ are the same or different and are each independently substituted or unsubstituted alkyl, for example $CH_3$, $R^{117}$ to $R^{120}$ are the same or different and are each independently hydrogen or substituted or unsubstituted alkyl, $n_{64}$, $n_{66}$, and $n_{68}$ are the same or different and are each independently integers ranging from 1 to 5, $n_{65}$, $n_{67}$, and $n_{69}$ are the same or different and are each independently integers ranging from 0 to 4, and $n_{70}$ is an integer ranging from 1 to 4, provided that $n_{64}+n_{65}$, $n_{66}+n_{67}$ and $n_{68}+n_{69}$ are the same or different and are each independently integers of 5 or less.

Exemplary phenol compounds include without limitation 3-hydroxy-4-ethylphenol, 2,6-dimethoxymethyl-4-t-butylphenol, 2,6-dimethoxymethyl-p-cresol, 2,6-diacetoxymethyl-p-cresol, and the like, and combinations thereof.

The positive photosensitive resin composition may include the phenol compound in an amount of about 1 to about 30 parts by weight based on 100 parts by weight of the polybenzoxazole precursor. In some embodiments, the positive photosensitive resin composition may include the phenol compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the phenol compound can be in a range from about any of the foregoing amounts to about any other of the foregoing amounts.

When the phenol compound is included in an amount within the above range, sensitivity during development may not decrease, and the dissolution rate of the non-exposed part may be suitably increased to provide a good pattern. In addition, precipitation during freezing can be minimized or eliminated to provide excellent storage stability.

(E) Solvent

The solvent may be an organic solvent such as but not limited to N-methyl-2-pyrrolidone, gamma-butyrolactone, N,N-dimethylacetamide, dimethylsulfoxide, diethyleneglycol dimethyl ether, diethyleneglycol diethylether, diethyleneglycol dibutylether, propyleneglycol monomethylether, dipropyleneglycol monomethylether, propyleneglycol monomethylether acetate, methyllactate, ethyllactate, butyllactate, methyl-1,3-butyleneglycol acetate, 1,3-butyleneglycol-3-monomethylether, methyl pyruvate, ethyl pyruvate, methyl-3-methoxy propionate, and the like, and combinations thereof. The solvent may be used singularly or in combination.

The positive photosensitive resin composition may include the solvent in an amount of about 50 parts by weight to about 400 parts by weight based on 100 parts by weight of the polybenzoxazole precursor. In some embodiments, the positive photosensitive resin composition may include the solvent in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, or 400 parts by weight. Further, according to some embodiments of the present invention, the amount of solvent can be in a range from about any of the foregoing amounts to about any other of the foregoing amounts.

When the solvent is used in an amount within the above range, a sufficiently thick film can be obtained, and good solubility and coating can be provided.

(F) Other Additive(s)

The positive photosensitive resin composition according to one embodiment of the present invention may further include other additives (F).

The other additive can include a latent thermal acid generator. Exemplary he latent thermal acid generators include without limitation arylsulfonic acids, such as p-toluenesulfonic acid, and a benzenesulfonic acid; perfluoroalkylsulfonic acids, such as trifluoromethanesulfonic acid, and trifluorobutanesulfonic acid; alkylsulfonic acids, such as methanesulfonic acid, ethanesulfonic acid, and butanesulfonic acid; and the like; and combinations thereof.

The latent thermal acid generator is a catalyst for the dehydration reaction of the phenolic hydroxyl group-contained polyamide of the polybenzoxazole precursor and cyclization reaction, and thus a cyclization reaction can be performed smoothly even if curing temperature is decreased.

In addition, the positive photosensitive resin composition may further include a suitable surfactant or leveling agent to prevent staining of the film or to improve development.

The process for forming a pattern using a positive photosensitive resin composition includes: coating a positive photosensitive resin composition on a supporting substrate; drying the coated positive photosensitive resin composition to provide a positive photosensitive resin composition layer; exposing the positive photosensitive resin composition layer; developing the exposed positive photosensitive resin composition layer in an alkali aqueous solution to provide a photosensitive resin film; and heating the photosensitive resin film. The conditions of processes to provide a pattern are widely known in this art, so detailed descriptions thereof will be omitted in this specification.

According to another embodiment of the present invention, a photosensitive resin film fabricated using the positive photosensitive resin composition is provided. The photosensitive resin film may be used as an insulation layer and/or a protective layer.

According to further another embodiment of the present invention, a semiconductor device including the photosensitive resin film is provided. The photosensitive resin composition according to the present invention can be used as an insulation layer, a passivation layer, and/or a buffer coating layer in a semiconductor device. The positive photosensitive resin composition may also be used to form a surface protective layer and/or an interlayer insulating layer of a semiconductor device.

According to further another embodiment of the present invention, an electronic device including the semiconductor device is provided.

EXAMPLE

The following examples illustrate the present invention in more detail. However, it is understood that the present invention is not limited by these examples.

Synthesis Example 1

Synthesis of a Polybenzoxazole Precursor (PBO-1)

23.1 g of 2,2-bis (3-amino-4-hydroxyphenyl)-1,1,1,3,3,3-hexafluoropropane and 12.4 g of 1-(3,5-diaminophenyl)-3-octadecyl succinimide are placed into a 4-necked flask with an agitator, a thermostat, a nitrogen gas injector, and a cooler, while nitrogen is passed through the flask, and 200 g of N-methyl-2-pyrrolidone (NMP) is dissolved therein.

When the solid is completely dissolved, 12.8 g of pyridine as a catalyst is placed into the solution. Then, another solution prepared by dissolving 23.1 g of 4,4'-oxydibenzoylchloride in 131 g of N-methyl-2-pyrrolidone (NMP) is slowly dripped in the resulting product for 30 minutes while the flask is maintained at a temperature ranging from 0° C. to 5° C. Then, the mixture is reacted at a temperature ranging from 0° C. to 5° C. for one hour, and then is reacted by agitating at room temperature of 25° C. for one hour. Next, 4.0 g of 5-norbornene-2,3-dicarboxylic anhydride is added to the resulting product and agitated for 2 hours at room temperature, completing the reaction. The reaction mixture is placed into a solution prepared by mixing water/methanol=10/1 at a volume ratio to produce a precipitate. The precipitate is filtered, then sufficiently rinsed with water, and dried at 80° C. under vacuum for 24 hours or more, synthesizing a polybenzoxazole precursor (PBO-1). The polybenzoxazole precursor (PBO-1) has a weight average molecular weight of 9,500.

Synthesis Example 2

Synthesis of a Polybenzoxazole Precursor (PBO-2)

20.5 g of 2,2-bis(3-amino-4-hydroxyphenyl)-1,1,1,3,3,3-hexafluoropropane and 9.1 g of 4-octadecoxy-1,3-benzenediamine are placed into a 4-necked flask with an agitator, a thermostat, a nitrogen gas injector, and a cooler while nitrogen is passed through the flask, and 232 g of N-methyl-2-pyrrolidone (NMP) is added thereto to dissolve them.

When the solid is completely dissolved, 11.4 g of pyridine as a catalyst is added to the solution, and another solution prepared by 20.5 g of 4,4'-oxydibenzoylchloride in 117 g of N-methyl-2-pyrrolidone(NMP) is slowly dripped therein for 30 minutes, while the flask is maintained at a temperature ranging from 0° C. to 5° C. The mixture is reacted for 1 hour at a temperature ranging from 0° C. to 5° C. and agitated at room temperature of 25° C. for one hour. Then, 3.5 g of 5-norbornene-2,3-dicarboxylic anhydride is added to the agitated reactant. The mixture is agitated for 2 hours at room temperature, completing the reaction. The reaction mixture is placed into a solution prepared by mixing water/methanol at a volume ratio of 10/1 for precipitation. The precipitate is filtered, sufficiently rinsed with water, and dried at 80° C. under vacuum for 24 hours or more, synthesizing a polybenzoxazole precursor (PBO-2). The polybenzoxazole precursor (PBO-2) has a weight average molecular weight of 9,200.

Synthesis Example 3

Synthesis of a Polybenzoxazole Precursor (PBO-3)

17.4 g of 2,2-bis(3-amino-4-hydroxyphenyl)-1,1,1,3,3,3-hexafluoropropane is dissolved in 280 g of N-methyl-2-pyrrolidone (NMP) in a 4-necked flask with an agitator, a thermostat, a nitrogen gas injector, and a cooler, while nitrogen is passed through the flask.

When the solid is completely dissolved, 9.9 g of pyridine as a catalyst is added to the solution, and another solution prepared by dissolving 13.3 g of 4,4'-oxydibenzoylchloride in 142 g of N-methyl-2-pyrrolidone (NMP) is slowly dripped in the mixture for 30 minutes, while maintained at a temperature ranging from 0° C. to 5° C. The mixture is reacted for 1 hour at a temperature ranging from 0° C. to 5° C. and then heated up to room temperature of 25° C. and agitated for one hour.

Then, 1.6 g of 5-norbornene-2,3-dicarboxylic anhydride is added to the reactant. The mixture is agitated at a room temperature of 25° C. for 2 hours, completing the reaction. The reaction mixture is precipitated in a solution prepared by mixing water/methanol at a volume ratio of 10/1. The precipitate is filtered, sufficiently rinsed with water, and dried at 80° C. under vacuum for 24 hours or more, synthesizing a polybenzoxazole precursor (PBO-3). The polybenzoxazole precursor (PBO-3) has a weight average molecular weight of 9,800.

Example 1

Preparation of a Positive Photosensitive Resin Composition 1.5 g of the polybenzoxazole precursor (PBO-1) according to Synthesis Example 1 and 13.5 g of the polybenzoxazole precursor (PBO-3) according to Synthesis Example 3 are dissolved in 35.0 g of γ-butyrolactone (GBL). Then, 3 g of a photosensitive diazoquinone compound represented by the following Chemical Formula 54, 0.75 g of trimethoxy[3-(phenylamino)propyl]silane represented by the following Chemical Formula 55, and 1.5 g of a phenol compound represented by the following Chemical Formula 56 are dissolved in the solution. The resulting solution is filtered using a 0.45 μm fluororesin filter, obtaining a positive photosensitive resin composition.

[Chemical Formula 54]

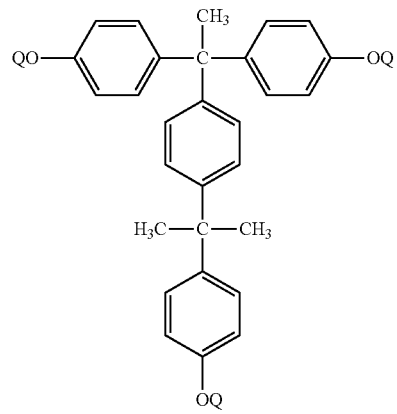

In Chemical Formula 54,

Q is the same as defined in the above Chemical Formula 39, and 67% of Q is substituted with the above Chemical Formula 40b.

[Chemical Formula 55]

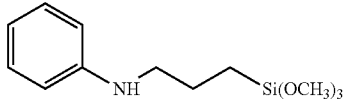

[Chemical Formula 56]

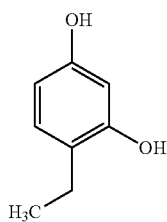

Example 2

Preparation of a Positive Photosensitive Resin Composition 4.5 g of the polybenzoxazole precursor (PBO-1) according to Synthesis Example 1 and 10.5 g of the polybenzoxazole precursor (PBO-3) according to Synthesis Example 3 are dissolved in 35.0 g of γ-butyrolactone (GBL), and 3 g of a photosensitive diazoquinone compound represented by the above Chemical Formula 54, 0.75 g of trimethoxy[3-(phenylamino)propyl]silane represented by the above Chemical Formula 55, and 1.5 g of a phenol compound represented by the above Chemical Formula 56 are dissolved therein. The resulting solution is filtered using a 0.45 μm fluororesin filter, obtaining a positive photosensitive resin composition.

Example 3

Preparation of a Positive Photosensitive Resin Composition 6.0 g of the polybenzoxazole precursor (PBO-1) according to Synthesis Example 1 and 9.0 g of the polybenzoxazole precursor (PBO-3) according to Synthesis Example 3 are dissolved in 35.0 g of γ-butyrolactone (GBL), and 3 g of a photosensitive diazoquinone compound represented by the above Chemical Formula 54, 0.75 g of trimethoxy[3-(phenylamino)propyl]silane represented by the above Chemical Formula 55, and 1.5 g of a phenol compound represented by the above Chemical Formula 56 are dissolved therein. The resulting solution is filtered using a 0.45 μm fluororesin filter, obtaining a positive photosensitive resin composition.

Example 4

Preparation of a Positive Photosensitive Resin Composition

A positive photosensitive resin composition is prepared according to the same method as in Example 1 except for using the polybenzoxazole precursor (PBO-2) according to Synthesis Example 2 instead of the polybenzoxazole precursor (PBO-1) according to Synthesis Example 1.

Example 5

Preparation of a Positive Photosensitive Resin Composition

A positive photosensitive resin composition is prepared according to the same method as in Example 2 except for using the polybenzoxazole precursor (PBO-2) according to Synthesis Example 2 instead of the polybenzoxazole precursor (PBO-1) according to Synthesis Example 1.

Example 6

Preparation of a Positive Photosensitive Resin Composition

A positive photosensitive resin composition is prepared according to the same method as in Example 3 except for using the polybenzoxazole precursor (PBO-2) according to Synthesis Example 2 instead of the polybenzoxazole precursor (PBO-1) according to Synthesis Example 1.

Example 7

Preparation of a Positive Photosensitive Resin Composition 15.0 g of the polybenzoxazole precursor (PBO-1) according to Synthesis Example 1 is dissolved in 35.0 g of γ-butyrolactone (GBL), and 3 g of a photosensitive diazoquinone compound represented by the above Chemical Formula 54, 0.75 g of trimethoxy[3-(phenylamino)propyl]silane represented by the above Chemical Formula 55, and 3.0 g of a phenol compound represented by the following Chemical Formula 56 are dissolved therein. The resulting solution is filtered using a 0.45 μm fluororesin filter, obtaining a positive photosensitive resin composition.

Comparative Example 1

Preparation of a Positive Photosensitive Resin Composition 15 g of the polybenzoxazole precursor (PBO-3) according to Synthesis Example 3 is dissolved in 35.0 g of γ-butyrolactone (GBL), and 3 g of a photosensitive diazoquinone compound represented by the above Chemical Formula 54, 0.75 g of trimethoxy[3-(phenylamino)propyl]silane represented by the above Chemical Formula 55, and 1.5 g of a phenol compound represented by the above Chemical Formula 56 are dissolved therein. The resulting solution is filtered using a 0.45 µm fluororesin filter, obtaining a positive photosensitive resin composition.

Comparative Example 2

Preparation of a Positive Photosensitive Resin Composition 15 g of the polybenzoxazole precursor (PBO-3) according to Synthesis Example 3 is dissolved in 35.0 g of γ-butyrolactone (GBL), and 3.75 g of a photosensitive diazoquinone compound represented by the above Chemical Formula 54, 0.75 g of trimethoxy[3-(phenylamino)propyl]silane represented by the above Chemical Formula 55, and 1.5 g of a phenol compound represented by the above Chemical Formula 56 are dissolved therein. The resulting solution is filtered using a 0.45 µm fluororesin filter, obtaining a positive photosensitive resin composition.

Comparative Example 3

Preparation of a Positive Photosensitive Resin Composition 15 g of the polybenzoxazole precursor (PBO-3) according to Synthesis Example 3 is dissolved in 35.0 g of γ-butyrolactone (GBL), and 4.5 g of a photosensitive diazoquinone compound represented by the following Chemical Formula 54, 0.75 g of trimethoxy[3-(phenylamino)propyl]silane represented by the above Chemical Formula 55, and 2.25 g of a phenol compound represented by the above Chemical Formula 56 are dissolved therein. The resulting solution is filtered with a 0.45 µm fluororesin filter, obtaining a positive photosensitive resin composition.

Experimental Example 1

Evaluation of Sensitivity, Resolution, Residual Film Ratio, and Scum Generation

Each positive photosensitive resin composition prepared from Examples 1 to 7 and Comparative Examples 1 to 3 are coated on a 8-inch wafer by a spin coater manufactured by Mikasa (1H-DX2), then heated on a hot plate to 120° C. for 4 minutes to provide a photosensitive polybenzoxazole precursor film.

The polybenzoxazol precursor film is exposed through a mask having patterns of various size by an I-line stepper (NSR i10C) manufactured by Japan Nikon for 250 ms, dissolved in a 2.38 wt % tetramethyl ammonium hydroxide aqueous solution at room temperature for 60 seconds (2 puddles) to remove the exposed part, and washed with pure water for 30 seconds. In addition, the obtained pattern is cured in an electric furnace under an oxygen concentration of 1000 ppm or below at 120° C. for 30 minutes and additionally at 320° C. for 1 hour to provide a patterned film.

In order to measure the sensitivity, the optimal exposure time is determined when a 10 µm L/S (line and space) pattern is formed in a line width of 1×1 after the exposure and development, and the resolution is determined as the minimum pattern size at the optimal exposure time. The results are shown in the following Table 1. The resolution is observed through an optical microscope.

Because decreased film thickness can affect the developability and the resulting film thickness, it can be advantageous to minimize loss of film thickness during the development. In order to measure this, the pre-baked film is immersed in a 2.38 wt % tetramethyl ammonium hydroxide (TMAH) aqueous solution at different times and rinsed with water, so the change of film thickness is measured to calculate the residual film ratio (thickness after development/thickness before development, unit: %). The results are shown in the following Table 1. The film thickness change after pre-baking, development, and curing is measured by using ST4000-DLX equipment manufactured by KMAC Co.

In addition, the scum generation is evaluated by examining if there is a residue on the wall and bottom of a pattern with a critical dimension scanning electron microscope (CD-SEM) (KLA Tencor 8100XP, KLA Instruments). The result is provided in the following Table 1.

<Evaluation Reference of Scum Generation>
None: no residue on the bottom
Scum: a residue on the bottom

TABLE 1

|  | Film thickness (µm) | | Residual film ratio (%) | Sensitivity (mJ/cm$^2$) | Resolution (µm) | Scum |
| --- | --- | --- | --- | --- | --- | --- |
|  | Pre-baking | After development | | | | |
| Example 1 | 10.2 | 9.2 | 90.2 | 390 | 3 | None |
| Example 2 | 10.0 | 9.2 | 92.0 | 420 | 4 | None |
| Example 3 | 9.8 | 9.3 | 94.9 | 490 | 4 | None |
| Example 4 | 10.0 | 9.0 | 90.0 | 400 | 3 | None |
| Example 5 | 10.2 | 9.3 | 91.2 | 410 | 4 | None |
| Example 6 | 10.1 | 9.5 | 94.1 | 480 | 4 | None |
| Example 7 | 10.0 | 9.5 | 95.0 | 470 | 4 | None |
| Comparative Example 1 | 9.8 | 7.8 | 79.6 | 350 | 5 | None |
| Comparative Example 2 | 9.9 | 8.7 | 87.9 | 510 | 7 | Scum |
| Comparative Example 3 | 10.0 | 8.5 | 85.0 | 450 | 5 | Scum |

As shown in Table 1, the positive photosensitive resin compositions including a polybenzoxazole precursor prepared by using hydrophobic diamine according to Examples 1 to 7 have an excellent residual film ratio of more than 90%, no scum, and excellent sensitivity and resolution.

On the contrary, the positive photosensitive resin compositions including no polybenzoxazole precursor prepared by using hydrophobic diamine according to Comparative Examples 1 to 3 exhibit deteriorated residual film ratio and resolution. The positive photosensitive resin composition according to Comparative Examples 2 and 3 have a scum.

In particular, Comparative Example 2 includes more photosensitive diazoquinone compound suppressing dissolution in an alkali development solution to improve deteriorated residual film ratio of Comparative Example 1. Comparative Example 2 exhibits improved residual film ratio compared with Comparative Example 1 but also deteriorated sensitivity and resolution and has a scum.

In addition, Comparative Example 3 includes more phenol compound for promoting dissolution in an alkali development solution to improve sensitivity and resolution of Comparative Example 2. Comparative Example 3 exhibits improved sensitivity and resolution compared with Comparative Example 2 but also deteriorated residual film ratio and still has a scum.

As a result, the data demonstrates that the positive photosensitive resin composition according to Examples 1 to 7 have excellent residual film ratio and resolution compared with the positive photosensitive resin compositions according to Comparative Examples 1 to 3, equivalent sensitivity to the positive photosensitive resin compositions according to Comparative Examples 1 to 3, and no scum.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising:

(A) a polybenzoxazole precursor including a first polybenzoxazole precursor including a repeating unit represented by the following Chemical Formula 1 and a repeating unit represented by the following Chemical Formula 2, and a repeating unit represented by the following Chemical Formula 32 and having a thermally polymerizable functional group at least one terminal end;

(B) a photosensitive diazoquinone compound;

(C) a silane compound;

(D) a phenol compound; and (E) a solvent:

[Chemical Formula 1]

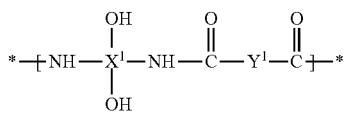

[Chemical Formula 2]

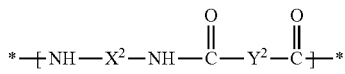

[Chemical Formula 32]

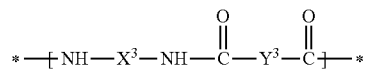

wherein in Chemical Formulae 1, 2, and 32, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a functional group represented by the following Chemical Formula 6 and 9 to 13 or a combination thereof:

[Chemical Formula 6]

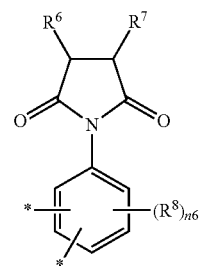

[Chemical Formula 9]

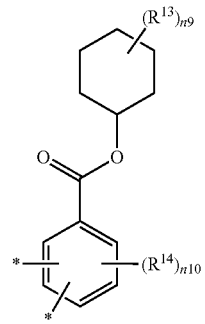

[Chemical Formula 10]

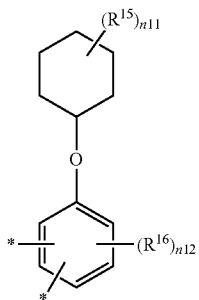

[Chemical Formula 11]

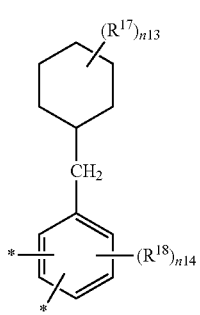

[Chemical Formula 12]

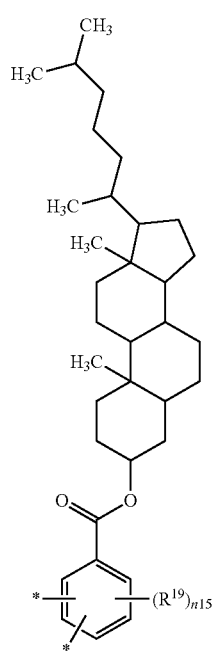

[Chemical Formula 13]

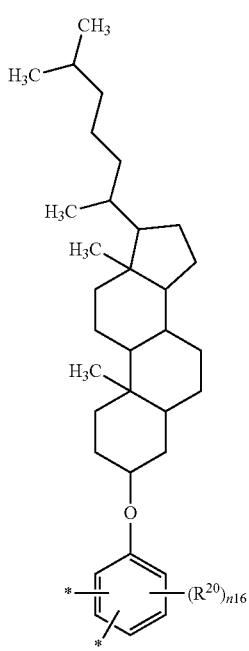

wherein in Chemical Formulae 6 and 9 to 13, $R^6$, $R^7$, $R^{13}$, $R^{15}$ and $R^{17}$ are the same or different in each repeating unit and are each independently hydrogen, fluorine, hydroxy, thiol, substituted or unsubstituted C1 to C30 carboxyl, or a substituted or unsubstituted C1 to C30 aliphatic organic group, $R^8$, $R^{14}$, $R^{16}$, $R^{18}$, $R^{20}$ are the same or different in each repeating unit and are each independently hydrogen, substituted or unsubstituted C1 to C30 alkyl, substituted or unsubstituted C1 to C30 carboxyl, hydroxy, or thiol, n9, n11 and n13 are each independently integers ranging from 1 to 5, and n6, n10, n12, n14, n15 and n16 are each independently integers ranging from 0 to 3, $X^3$ is the same or different in each repeating unit and is each independently an aromatic organic group or an alicyclic organic group derived from an aromatic diamine or an alicyclic diamine selected from the group consisting of 3,4'-diamianodiphenylether, 4,4'-diaminodiphenylether, 3,4'-diaminodiphenylemthane, 4,4'-diaminodiphenylmethane, 4,4'-diaminodipheylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl) sulfone, bis(4-aminophenoxy)biphenyl, bis[4-(4-aminophenoxy)phenyl]ether, 1,4-bis(4-aminophenoxy) benzene, compounds including an aromatic ring of the foregoing amines substituted with an alkyl group or a halogen, 1,4-diaminocyclohexane, 1,3-diaminocyclohexane, 1,2-diaminocyclohexane, 4,4'methtlenebiscyclohexylamine, 4,4'-methylenebis(2-methylcyclohexylamine), and combinations thereof, and $Y^1$, $Y^2$, and $Y^3$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, wherein the first polybenzoxazole precursor comprises about 5 parts by mole to about 40 parts by mole of the repeating unit reoresented by Chemical Formula 2 and about 5 parts by mole to about 40 parts by mole of the repeating unit represented by Chemical Formula 32, based on 100 parts by mole of the repeating unit represented by Chemical Formula 1.

2. The positive photosensitive resin composition of claim 1, wherein the first polybenzoxazole precursor comprises a repeating unit represented by Chemical Formula 1 and a repeating unit represented by Chemical Formula 2 in a mole ratio of about 60:40 to about 95:5.

3. The positive photosensitive resin composition of claim 1, wherein the first polybenzoxazole precursor has a weight average molecular weight (Mw) of about 4,000 g/mol to about 20,000 g/mol.

4. The positive photosensitive resin composition of claim 1, wherein the polybenzoxazole precursor comprises a second polybenzoxazole precursor including a repeating unit represented by the following Chemical Formula 38, and a thermally polymerizable functional group at least one terminal end:

[Chemical Formula 38]

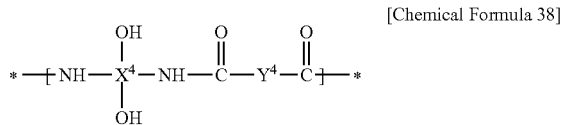

wherein, in Chemical Formula 38, $X^4$ are the same or different in each repeating unit and are each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

5. The positive photosensitive resin composition of claim 4, wherein the second polybenzoxazole precursor has a weight average molecular weight (Mw) of about 4,000 g/mol to about 20,000 g/mol.

6. The positive photosensitive resin composition of claim 4, wherein the polybenzoxazole precursor comprises the first polybenzoxazole precursor and the second polybenzoxazole precursor in a weight ratio of about 5:95 to about 95:5.

7. The positive photosensitive resin composition of claim 1, wherein the positive photosensitive resin composition comprises about 5 parts by weight to about 100 parts by weight of photosensitive diazoquinone compound (B);

about 0.1 parts by weight to about 30 parts by weight of the silane compound (C);

about 1 part by weight to about 30 parts by weight of the phenol compound (D); and about 50 parts by weight to about 400 parts by weight of the solvent (E), based on 100 parts by weight of the polybenzoxazole precursor (A).

8. A photosensitive resin film fabricated using the positive photosensitive resin composition of claim 1.

9. A semiconductor device comprising the photosensitive resin film according to claim 8.

10. The positive photosensitive resin composition of claim 1, wherein $X^2$ includes a functional group represented by Chemical Formula 6:

[Chemical Formula 6]

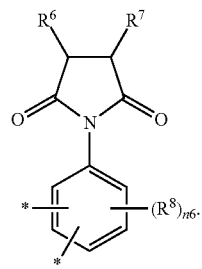

11. The positive photosensitive resin composition of claim 1, wherein $X^2$ includes a functional group represented by Chemical Formula 9:

[Chemical Formula 9]

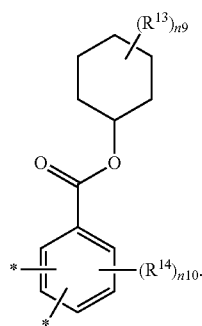

12. The positive photosensitive resin composition of claim 1, wherein $X^2$ includes a functional group represented by Chemical Formula 10:

[Chemical Formula 10]

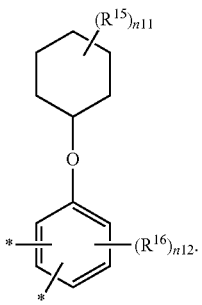

13. The positive photosensitive resin composition of claim 1, wherein $X^2$ includes a functional group represented by Chemical Formula 11:

[Chemical Formula 11]

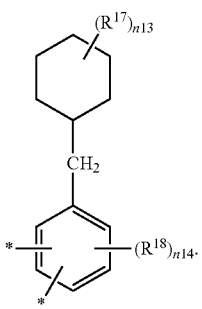

14. The positive photosensitive resin composition of claim 1, wherein $X^2$ includes a functional group represented by Chemical Formula 12:

[Chemical Formula 12]

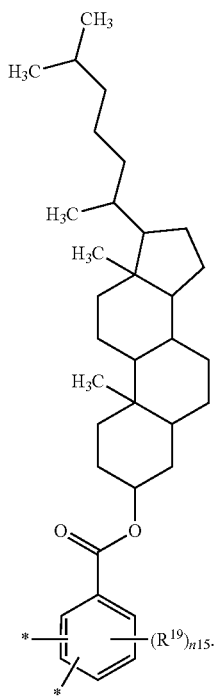

15. The positive photosensitive resin composition of claim 1, wherein $X^2$ includes a functional group represented by Chemical Formula 13:

[Chemical Formula 13]

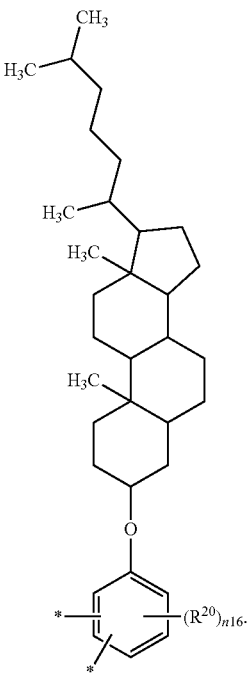

16. The positive photosensitive resin composition of claim 1, wherein $X^3$ is an alicyclic organic group derived from an alicyclic diamine selected from the group consisting of 1,4-diaminocyclohexane, 1,3-diaminocyclohexane, 1,2-diaminocyclohexane, 4,4'-methylenebiscyclohexylamine, 4,4'-methylenebis(2-methylcyclohexylamine), and combinations thereof.

* * * * *

UNITED STATES PATENT AND TRADEMARK OFFICE
CERTIFICATE OF CORRECTION

PATENT NO. : 9,268,221 B2
APPLICATION NO. : 13/190690
DATED : February 23, 2016
INVENTOR(S) : Ji-Young Jeong et al.

It is certified that error appears in the above-identified patent and that said Letters Patent is hereby corrected as shown below:

In the Specification

Column 24, Chemical Formula 41 is depicted as:

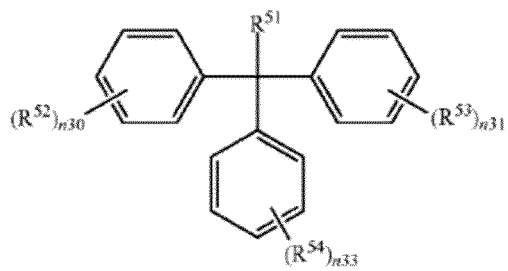

and should be depicted as:

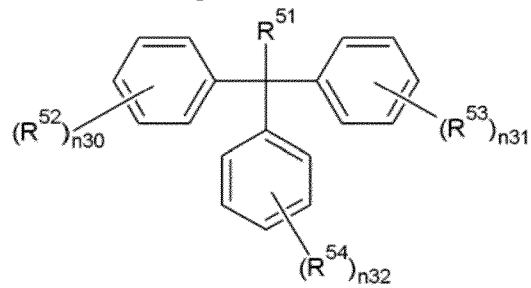

Column 26, Line 5 omitted "[Chemical Formula 45]"

Column 26, Chemical Formula 45 is depicted as:

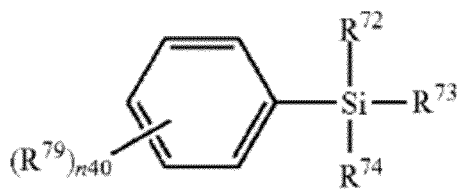

Signed and Sealed this
Twenty-fourth Day of May, 2016

Michelle K. Lee
*Director of the United States Patent and Trademark Office* and should be depicted as:
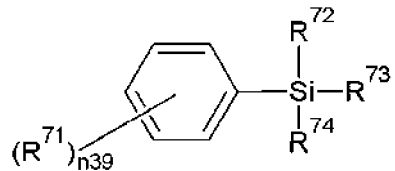
In the Claims
Claim 1, Column 37, Line 42 reads: "sented by the following Chemical Formula 1 and a" and should read: "sented by the following Chemical Formula 1, a"
Claim 1, Column 40, Line 7 reads: "$R^8$, $R^{14}$, $R^{16}$, $R^{18}$, $R^{20}$ are the same or different in each" and should read: "$R^8$, $R^{14}$, $R^{16}$, $R^{18}$, $R^{19}$ and $R^{20}$ are the same or different in each"